United States Patent
Pan

[11] Patent Number: 5,973,346
[45] Date of Patent: *Oct. 26, 1999

[54] LOW-PROFILE SHALLOW TRENCH DOUBLE POLYSILICON CAPACITOR

[75] Inventor: Yang Pan, Singapore, Singapore

[73] Assignee: Chartered Semicoductor Manufacturing Company, Ltd., Singapore, Singapore

[*] Notice: This patent issued on a continued prosecution application filed under 37 CFR 1.53(d), and is subject to the twenty year patent term provisions of 35 U.S.C. 154(a)(2).

[21] Appl. No.: 08/966,737

[22] Filed: Nov. 10, 1997

Related U.S. Application Data

[62] Division of application No. 08/858,290, May 19, 1997, Pat. No. 5,691,252, which is a continuation of application No. 08/523,340, Sep. 5, 1995, abandoned.

[51] Int. Cl.$^6$ .......................... H01L 27/108; H01L 29/76; H01L 29/94; H01L 31/119
[52] U.S. Cl. .......................... 257/303; 257/304; 257/311; 438/244; 438/248; 438/387; 438/393
[58] Field of Search ..................................... 257/303, 311, 257/304; 438/244, 387, 248, 393, 394

[56] References Cited

U.S. PATENT DOCUMENTS

| | | | |
|---|---|---|---|
| 5,173,437 | 12/1992 | Chi | 437/60 |
| 5,200,353 | 4/1993 | Inuishi | 438/244 |
| 5,394,000 | 2/1995 | Ellul et al. | 257/301 |
| 5,429,981 | 7/1995 | Gardner et al. | 438/394 |

*Primary Examiner*—Olik Chaudhuri
*Assistant Examiner*—Howard Weiss
*Attorney, Agent, or Firm*—George O. Saile; Rosemary L. S. Pike; Alek P. Szecsy

[57] ABSTRACT

A double layer planar polysilicon capacitor for use within integrated circuits and a method by which that planar polysilicon capacitor is formed. Formed within a semiconductor substrate is a deep trench which is filled with a dielectric material. Formed within the dielectric material within the deep trench is a shallow trench which has a first polysilicon capacitor plate formed therein. The upper surface of the first polysilicon capacitor plate is substantially planar with the semiconductor substrate. Formed upon the first polysilicon capacitor plate is a polysilicon capacitor dielectric layer. Formed upon the polysilicon capacitor dielectric layer is a second polysilicon capacitor plate.

7 Claims, 3 Drawing Sheets

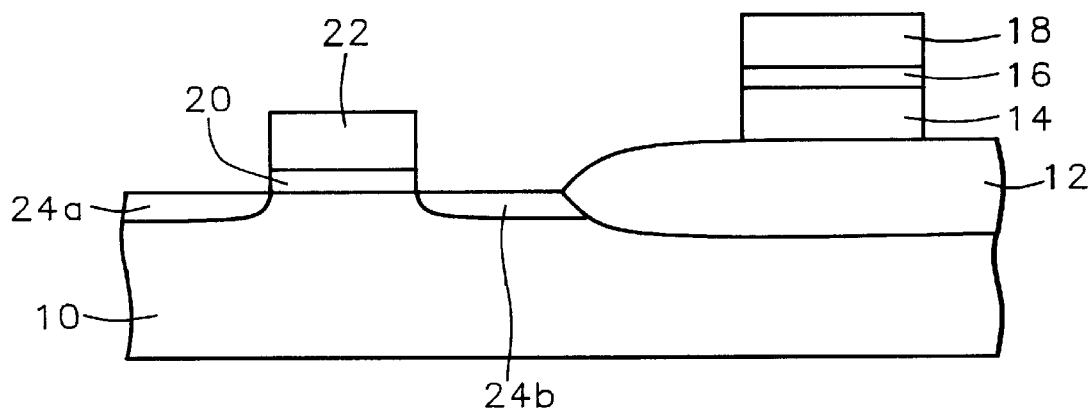
FIG. 1 – Prior Art
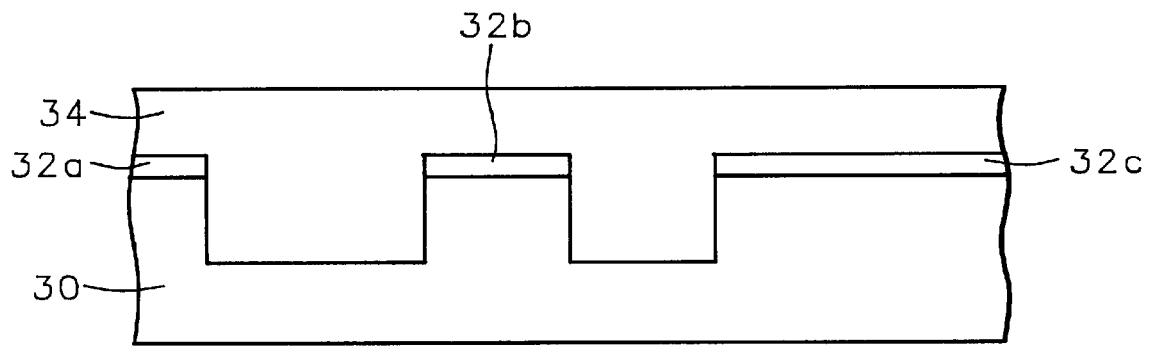
FIG. 2
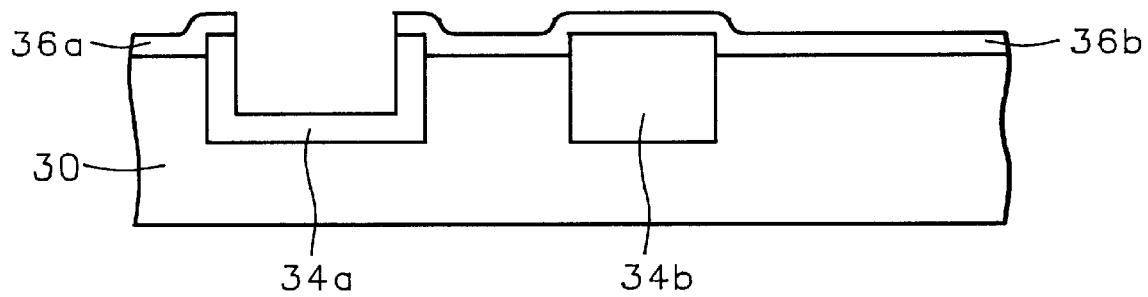
FIG. 3

LOW-PROFILE SHALLOW TRENCH DOUBLE POLYSILICON CAPACITOR

CROSS-REFERENCE TO RELATED APPLICATION

This application is a divisional application of application Ser. No. 08/858,290, filed 19 May 1997, now U.S. Pat. No. 5,691,252, which in turn is a file wrapper continuation application of application Ser. No. 08/523,340, filed 05 Sep. 1995, now abandoned.

BACKGROUND OF THE INVENTION

1. Field of the Invention

The present invention relates generally to capacitors formed within integrated circuits. More particularly, the present invention relates to a double layer polysilicon capacitor formed within a shallow trench for use within integrated circuits.

2. Description of Related Art

Integrated circuits are typically fabricated from semiconductor substrates upon and within whose surfaces are formed resistors, transistors, diodes and other electrical circuit elements. These electrical circuit elements are connected internally and externally to the semiconductor substrate upon which they are formed through conductor layers which are separated by insulator layers.

In addition to the use of transistors as switching elements within integrated circuits, and the use of resistors as electrical circuit load elements within integrated circuits, capacitors are also commonly employed within integrated circuits. Typically, capacitors within integrated circuits are employed as charge storage elements within digital integrated circuits or as passive electrical circuit elements within analog integrated circuits.

A common method for forming capacitors within integrated circuits is to form upon a semiconductor substrate two doped polysilicon layers which are separated by an insulating layer. A capacitor formed through this method is referred to as a planar polysilicon capacitor. A typical planar polysilicon capacitor within an integrated circuit is illustrated within the cross-sectional schematic diagram shown in FIG. 1.

FIG. 1 shows a semiconductor substrate 10 within and upon whose surface is formed a Field OXide (FOX) isolation region 12. The FOX isolation region 12 defines the active semiconductor region of the semiconductor substrate 10. Within the active semiconductor region may be formed transistors, resistors, diodes and other electrical circuit elements. For example, FIG. 1 illustrates a field effect transistor structure formed within the active semiconductor region. The field effect transistor structure comprises a gate electrode 22 which resides upon a gate oxide 20, and a pair of source/drain electrodes 24a and 24b.

Typically, planar polysilicon capacitors within integrated circuits are formed upon the surfaces of FOX isolation regions within those integrated circuits. Thus, within FIG. 1, a conventional planar polysilicon capacitor is illustrated by a first polysilicon layer 14 and a second polysilicon layer 18 separated by an insulating layer 16, all of which layers are formed upon the surface of the FOX isolation region 12.

An unfortunate consequence of forming planar polysilicon capacitors upon the surfaces of FOX isolation regions within integrated circuits is the substantial step height from the top surface of the planar polysilicon capacitor to the top surfaces of the surrounding integrated circuit features formed upon active semiconductor regions. This substantial step height may provide fundamental problems in forming sufficiently thin planarized insulator layers over integrated circuit features adjoining planar polysilicon capacitors formed upon FOX isolation regions. The fundamental problems may limit the ability to form fully functional and reliable integrated circuits. It is thus towards the goal of forming within integrated circuits planar polysilicon capacitors of height comparable to adjoining integrated circuit features within those integrated circuits that the present invention is directed.

The design and fabrication of planar polysilicon capacitors are known in the art. For example, Chi in U.S. Pat. No. 5,173,437 describes a method for forming a double layer planar polysilicon capacitor compatible with sub-micron processing schemes for advanced integrated circuits. The disclosed method provides a planar polysilicon capacitor which is not susceptible to forming polysilicon stringers which deteriorate the electrical performance of planar polysilicon capacitors and the advanced integrated circuits into which those planar polysilicon capacitors are formed.

In addition, a related disclosure from this laboratory, Yang Pan, "Three Dimensional Polysilicon Capacitor for High Density Integrated Circuit Applications," U.S. Pat. No. 5,744,853, discloses a polysilicon capacitor formed of patterned and inter-leafed polysilicon electrode layers. The disclosed polysilicon capacitor provides the greater levels of areal capacitance needed for advanced integrated circuits.

Desirable in the art is a planar polysilicon capacitor of height similar to surrounding integrated circuit features within integrated circuits within which that planar polysilicon capacitor is formed. Preferably, the planar polysilicon capacitor is formed while simultaneously maintaining the electrical characteristics of that planar polysilicon capacitor.

SUMMARY OF THE INVENTION

A first object of the present invention is to provide a planar polysilicon capacitor of height similar to surrounding integrated circuit features within the integrated circuit within which that planar polysilicon capacitor is formed, while simultaneously maintaining the electrical characteristics of that planar polysilicon capacitor.

A second object of the present invention is to provide a planar polysilicon capacitor in accord with the first object of the present invention, which planar polysilicon capacitor is also readily manufacturable.

A third object of the present invention is to provide a planar polysilicon capacitor in accord with the first object of the present invention and the second object of the present invention, which planar polysilicon capacitor is also economical.

In accord with the objects of the present invention, a new method for forming a planar polysilicon capacitor within an integrated circuit is disclosed along with the planar polysilicon capacitor which results from that method. To form the planar polysilicon capacitor of the present invention, there is first formed within a semiconductor substrate a deep trench which is filled with a dielectric material. Formed then within the dielectric material within the deep trench is a shallow trench. Formed within the shallow trench is a first polysilicon capacitor plate. The upper surface of the first polysilicon capacitor plate is substantially planar with the surface of the semiconductor substrate. Formed upon the first polysilicon capacitor plate is a polysilicon capacitor dielectric layer, and formed upon the polysilicon capacitor dielectric layer is a second polysilicon capacitor plate.

The planar polysilicon capacitor of the present invention has a height similar to surrounding integrated circuit features within the integrated circuit within which is formed the planar polysilicon capacitor of the present invention, while simultaneously maintaining electrical characteristics equivalent to planar polysilicon capacitors of equivalent dimensions formed in other locations within the same integrated circuit. The planar polysilicon capacitor of the present invention is formed into a shallow trench within a dielectric material, which dielectric material in turn is formed into a deep trench within a semiconductor substrate. By forming the planar polysilicon capacitor of the present invention into a shallow trench within a semiconductor substrate, rather than forming the planar polysilicon capacitor upon the surface of a Field OXide (FOX) isolation region within and upon a semiconductor substrate, as is common in the art, the height of the planar polysilicon capacitor of the present invention is comparable to surrounding integrated circuit features within the integrated circuit within which is formed the planar polysilicon capacitor of the present invention. Since only the location, and not the design parameters, of the planar polysilicon capacitor of the present invention has changed, the electrical characteristics of the planar polysilicon capacitor of the present invention remain unchanged.

The planar polysilicon capacitor of the present invention is readily manufacturable. In order to form the planar polysilicon capacitor of the present invention it is required to: (1) form a deep trench within a semiconductor substrate and fill that deep trench with a dielectric material, and (2) form a shallow trench within the dielectric material formed within the deep trench and fill that shallow trench with a first polysilicon capacitor plate. Methods and materials through which deep trenches may be etched into semiconductor substrates and dielectric materials deposited within those deep trenches are known in the art. In addition, methods through which shallow trenches may be formed within dielectric materials formed within deep trenches, and conductive polysilicon materials filled into those shallow trenches are known in the art. Thus, the method through which is formed the planar polysilicon capacitor of the present invention is readily manufacturable.

The planar polysilicon capacitor of the present invention is economical. The planar polysilicon capacitor of the present invention requires neither any new materials nor any new manufacturing processes for its production. In the sense that the planar polysilicon capacitor of the present invention may be produced through conventional methods and materials, the planar polysilicon capacitor of the present invention is economical.

BRIEF DESCRIPTION OF THE DRAWINGS

The following drawings, which form a material part of this disclosure, show the following:

FIG. 1 shows a schematic cross-sectional diagram illustrating a planar polysilicon capacitor of the prior art.

FIG. 2 to FIG. 7 show schematic cross-sectional diagrams illustrating progressive stages in forming the planar polysilicon capacitor of the preferred embodiment of the present invention into an integrated circuit.

DESCRIPTION OF THE PREFERRED EMBODIMENT

Figure 4:
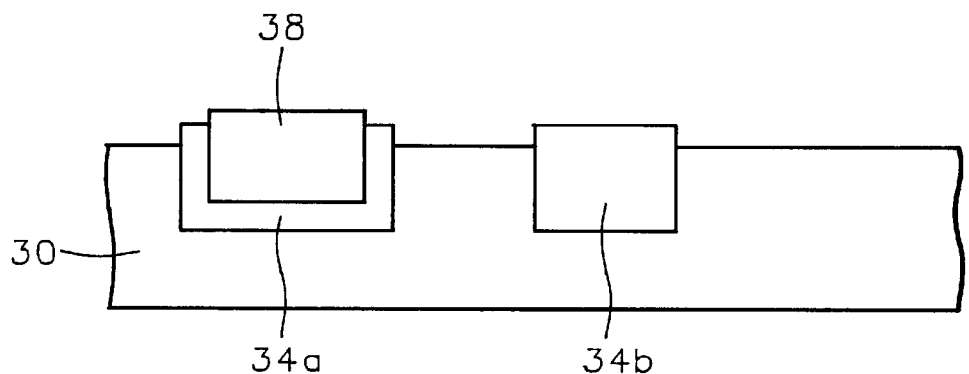

The method of the present invention provides a planar polysilicon capacitor formed partially into a shallow trench within a dielectric material, which dielectric material in turn is formed into a deep trench within a semiconductor substrate. By forming the planar polysilicon capacitor of the present invention partially into the shallow trench, the portion of the planar polysilicon capacitor of the present invention exposed above the shallow trench will have a height comparable to adjoining features within the integrated circuit within which is formed the planar polysilicon capacitor of the present invention. The planar polysilicon capacitor of the present invention, when formed partially within the shallow trench has electrical characteristics equivalent to planar polysilicon capacitors of equivalent dimensions formed within or upon other locations within the same integrated circuit.

Although the planar polysilicon capacitor of the present invention is most likely to replace conventional planar polysilicon capacitors formed upon surfaces of Field OXide (FOX) isolation regions within integrated circuits, the planar polysilicon capacitor of the present invention has broader applicability within integrated circuits. The planar polysilicon capacitor of the present invention may be employed in any integrated circuit where there is needed a planar polysilicon capacitor of height comparable to the integrated circuit features which surround that planar polysilicon capacitor. The planar polysilicon capacitor of the present invention may be employed in integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications field effect transistors and integrated circuits having within their fabrications bipolar transistors. The planar polysilicon capacitor of the present invention has broad applicability within integrated circuits.

Referring now to FIG. 2 to FIG. 7 there is show a series of schematic cross-sectional diagrams illustrating progressive stages in forming the planar polysilicon capacitor of the preferred embodiment of the present invention into an integrated circuit.

Shown in FIG. 2 is the planar polysilicon capacitor and the integrated circuit at early stages of fabrication. Shown in FIG. 2 is a semiconductor substrate 30 upon whose surface has been formed patterned first mask layers 32a, 32b and 32c. The portions of the semiconductor substrate 30 exposed between the patterned first mask layers 32a and 32b, and the patterned first mask layers 32b and 32c, respectively, have been removed to form a first deep trench and a second deep trench. Formed upon the semiconductor substrate 30 and formed into the first deep trench and the second deep trench is a blanket trench fill dielectric layer 34.

Semiconductor substrates upon which the present invention may be practiced may be formed with either dopant polarity, any dopant concentration and any crystallographic orientation. Typically, the semiconductor substrate 30 upon which the present invention is practiced is either an N- or P- silicon semiconductor substrate having a (100) crystallographic orientation.

Methods and materials through which silicon semiconductor substrates may be masked and deep trenches formed within those substrates are known in the art. Masks may be formed of materials including but not limited to organic photoresist materials and patterned inorganic materials such as silicon oxides, silicon nitrides and silicon oxynitrides. Silicon semiconductor substrates may be etched through methods including but not limited to wet chemical etch methods and dry plasma Reactive Ion Etch (RIE) methods.

For the preferred embodiment of the present invention, the semiconductor substrate 30 is preferably masked with patterned first mask layers 32a, 32b and 32c formed of silicon nitride, and the semiconductor substrate 30 is etched to form the first deep trench between the patterned first masking layers 32a and 32b and the second deep trench between patterned first masking layers 32b and 32c. Preferably, the thickness of the patterned first mask layers 32a, 32b and 32c are about 200 to about 2000 angstroms each. The etching is preferably accomplished through a Reactive Ion Etch (RIE) plasma process employing chlorine and bromine species as etchants. Preferably, the depth of the deep trench is from about 5000 to about 10000 angstroms. Other etch processes and etchants may be employed, although variations in etched deep trench profiles may be observed.

Also known in the art are dielectric materials which may be employed to fill deep trenches formed within semiconductor substrates. Such dielectric materials include but are not limited to silicon oxide materials, silicon nitride materials and silicon oxynitride materials. For the preferred embodiment of the present invention, the blanket trench fill dielectric layer 34 is preferably formed of a silicon oxide material deposited through a Chemical vapor Deposition (CVD) method, as is most common in the art. Alternative methods and materials may be employed in forming the blanket trench fill dielectric layer 34 provided that the blanket trench fill dielectric layer 34 has sufficiently different etching and polishing characteristics as a substrate in comparison with the patterned first mask layers 32a, 32b and 32c.

Referring now to FIG. 3 there is shown a schematic cross-sectional diagram illustrating the results of the next series of process steps in forming the planar polysilicon capacitor of the preferred embodiment of the present invention. Shown in FIG. 3 are patterned trench fill dielectric layers 34a and 34b, filled respectively into the first deep trench and the second deep trench. As is seen from FIG. 3, patterned trench fill dielectric layer 34a has formed into its surface a shallow trench. Also shown in FIG. 3 are the patterned second mask layers 36a and 36b which have replaced the patterned first mask layers 32a, 32b and 32c as illustrated in FIG. 2. Patterned second mask layers 36a and 36b define the shallow trench which is formed into the patterned trench fill dielectric layer 34a.

In order to form the integrated circuit structure of FIG. 3 from the integrated circuit structure of FIG. 2, several sequential processing steps are undertaken. First, the blanket trench fill dielectric layer 34 is planarized until the surfaces of the patterned first mask layers 32a, 32b and 32c are reached. Next the patterned first mask layers 32a, 32b and 32c are removed and replaced with patterned second mask layers 36a and 36b which define the location of the shallow trench within the planarized trench fill dielectric material which fills the first deep trench. Finally, the shallow trench is etched into the trench fill dielectric material which fills the first deep trench, thus forming the patterned trench fill dielectric layer 34a. The methods and materials through which each of these three processing steps may be accomplished are conventional to the art.

For example, the planarizing of blanket dielectric layers to the surfaces of deep trenches into which are filled those blanket dielectric layers be accomplished through methods including but not limited to Reactive Ion Etch (RIE) etchback planarizing methods and Chemical-Mechanical Polish (CMP) planarizing methods. Subsequent to such planarizing, masking layers which serve as stop layers for the planarizing methods may be removed through methods including but not limited to wet chemical etch methods and dry plasma etch methods as are known in the art. Finally, etching of shallow trenches into planarized dielectric layers formed within deep trenches may also be accomplished through wet chemical etch methods and dry plasma etch methods as are known in the art.

For the preferred embodiment of the planar polysilicon capacitor of the present invention, the blanket trench fill dielectric layer 34 is preferably planarized to the surfaces of the patterned first mask layers 32a, 32b and 32c through a Chemical-Mechanical Polish (CMP) process employing a silicon oxide polishing slurry. When the blanket trench fill dielectric layer 34 is planarized through this method, the patterned first mask layers 32a, 32b and 32c, which are preferably formed from silicon nitride, serve as a stopping layer. The silicon nitride patterned first mask layers 32a, 32b and 32c may then be removed through conventional means including but not limited to Reactive Ion Etch (RIE) etching in a fluorine containing plasma and wet chemical etching in phosphoric acid.

Once the patterned first mask layers 32a, 32b and 32c have been removed from the surface of the semiconductor substrate 30, the patterned second mask layers 36a and 36b may be formed through methods and materials analogous to the methods and materials through which are formed the patterned first mask layers 32a, 32b and 32c. Preferably, the patterned second mask layers 36a and 36b are also formed from silicon nitride. Preferably, the patterned second mask layers 36a and 36b are from about 200 to about 2000 angstroms thick each. Finally, the shallow trench formed within the planarized trench fill dielectric layer which fills the first deep trench may be formed through methods analogous to those employed in forming the first deep trench and the second deep trench within the semiconductor substrate 30. However, the materials employed in etching the shallow trench will be different than those employed in etching the deep trenches. Preferably, the shallow trench is etched into the silicon oxide trench fill dielectric material to form the patterned trench fill dielectric layer 34a through a Reactive Ion Etch (RIE) etching method employing fluorine containing species. Preferably, the shallow trench is from about 1000 to about 5000 angstroms deep.

Having formed the shallow trench which leaves the patterned trench fill dielectric layer 34a remaining within the first deep trench, the process steps in forming the planar polysilicon capacitor of the present invention into that shallow trench may proceed. The results of the first of those process steps is illustrated in FIG. 4.

FIG. 4 illustrates the presence of a first polysilicon capacitor plate 38 formed within the shallow trench. The first polysilicon capacitor plate 38 is formed through planarizing a blanket polysilicon layer which is formed upon the surface of the semiconductor substrate 30 illustrated in FIG. 3. The blanket polysilicon layer may be formed through methods as are conventional in the art, including but not limited to Chemical Vapor Deposition (CVD) and Plasma Enhanced Chemical Vapor Deposition (PECVD) methods employing silicon source materials including but not limited to silane, disilane and silicon chloride. After the blanket polysilicon layer has been formed of sufficient thickness to completely fill the shallow trench, excess portions of the blanket polysilicon layer may be removed through an etching or polishing planarizing process using the silicon nitride patterned second mask layers 36a and 36b as stop layers.

After planarizing the blanket polysilicon layer to form the first polysilicon capacitor plate 38, the patterned second mask layers 36a and 36b are removed through methods analogous to the methods employed in removing the patterned first masking layers 32a, 32b and 32c. The structure that results is illustrated in FIG. 4. As shown in FIG. 4, the first polysilicon capacitor plate 38 is substantially planar with the surface of the semiconductor substrate 30. The first polysilicon capacitor plate 38 rises above the semiconductor substrate 30 surface, at most, by the thicknesses of the patterned first mask layers 32a and 32b and the patterned second mask layers 36a and 36b.

For the preferred embodiment of the planar polysilicon capacitor of the present invention, the thickness of the first polysilicon capacitor plate 38 is preferably about 1000 to about 5000 angstroms. In addition, the first polysilicon capacitor plate 38 is preferably formed via planarizing of a blanket polysilicon through a Chemical-Mechanical Polish (CMP) method employing a polysilicon slurry. As is understood by a person skilled in the art, insofar as the blanket polysilicon layer from which is formed the first polysilicon capacitor plate 38 is formed of sufficient thickness to completely fill the shallow trench, and excess portions of the blanket polysilicon layer are preferably removed employing a planarizing process, such as a chemical mechanical polish (CMP) planarizing process, while using the silicon nitride patterned mask layers 36a and 36b as stop layers, the upper surface of the first polysilicon capacitor plate 38 is inherently formed as a planar surface, without interruption, as illustrated in part within FIG. 4.

In order to provide a functional capacitor, the first polysilicon capacitor plate 38 must also be conductive. Preferably, the first polysilicon capacitor plate 38 is made conductive by forming the first polysilicon capacitor plate 38 from polysilicon with about $1 \times 10^{19}$ to about $1 \times 10^{21}$ dopant atoms per cubic centimeter. Preferably, although not exclusively, the dopant is incorporated in-situ into the blanket polysilicon layer from which is formed the first polysilicon capacitor plate 38.

Once having formed the first polysilicon capacitor plate 38, additional layers of the planar polysilicon capacitor of the preferred embodiment of the present invention may then be formed. Schematic cross-sectional diagrams which illustrate those additional layers are shown in FIG. 5 and FIG. 6.

Figure 5:
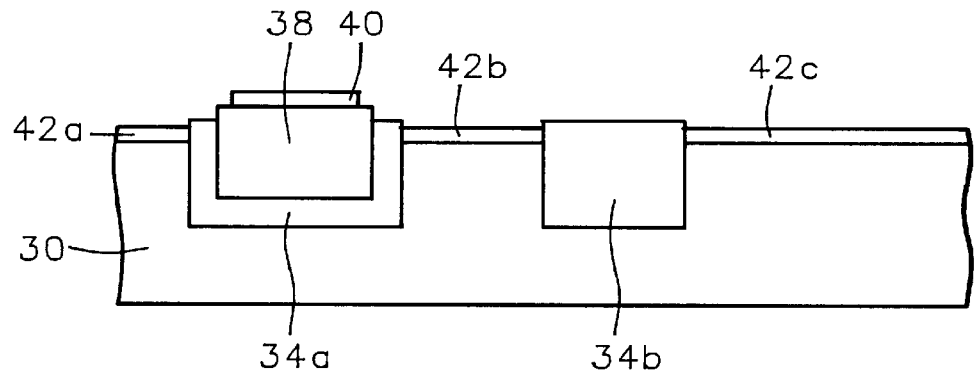

Shown in FIG. 5 is the presence of a polysilicon capacitor dielectric layer 40 formed upon the surface of the first polysilicon capacitor plate 38. Polysilicon capacitor dielectric layers are well known in the art. Typically, they are formed of materials including but not limited to silicon oxide materials, silicon nitride materials and silicon oxynitride materials formed upon the surfaces of polysilicon capacitor plates through methods including but not limited to thermal oxidation methods, Chemical Vapor Deposition (CVD) methods and Physical Vapor Deposition (PVD) sputtering methods. For the preferred embodiment of the present invention, the polysilicon capacitor dielectric layer 40 is preferably formed of a composite formed from a thermally grown oxide layer upon which is deposited a silicon nitride layer. The top surface of the silicon nitride layer is preferably oxidized. Preferably, the overall thickness of the polysilicon capacitor dielectric layer 40 is from about 100 to about 1000 angstroms.

Also shown in FIG. 5 is the presence of thermally grown oxide layers 42a, 42b and 42c which are formed independently and subsequently to the polysilicon capacitor dielectric layer 40. The thermally grown oxide layers 42a, 42b and 42c are preferably formed at a temperature of about 750 to about 1150 degrees centigrade for a time period sufficient to form thermally grown oxide layers 42a, 42b and 42c of thickness of about 40 to about 200 angstroms each.

Figure 6:
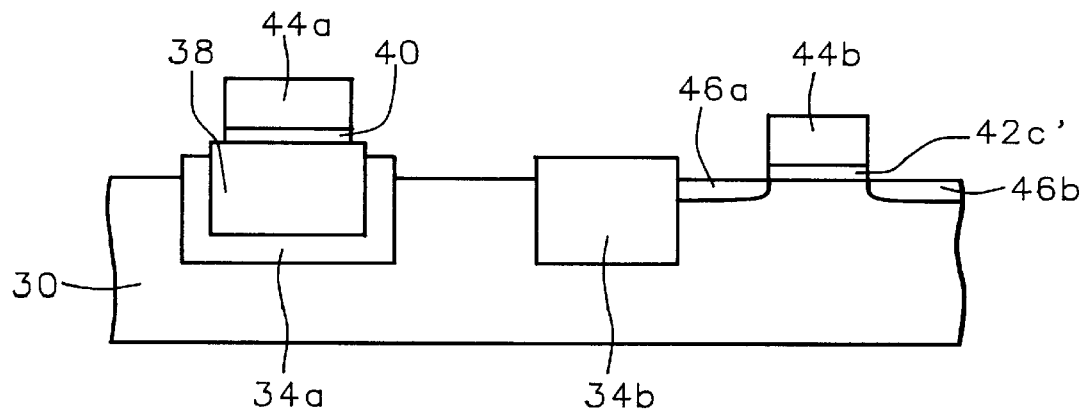

Referring now to FIG. 6 there is shown the last series of process steps in forming the planar polysilicon capacitor of the preferred embodiment of the present invention. Shown in FIG. 6 is the presence of a second polysilicon capacitor plate 44a and a polysilicon electrode 44b. As is illustrated within FIG. 6, the second polysilicon capacitor plate 44b is formed over and rises above the first polysilicon capacitor plate 38. Similarly, an upper surface of the second polysilicon capacitor plate 44b rises above an upper surface of the first polysilicon capacitor plate 38. The second polysilicon capacitor plate 44a and the polysilicon electrode 44b are formed simultaneously through patterning of a second blanket polysilicon layer formed upon the surface of the semiconductor substrate illustrated in FIG. 5. The second blanket polysilicon layer is formed through methods and materials analogous to those employed in forming the blanket polysilicon layer from which is formed the first polysilicon capacitor plate 38. Analogously to the blanket polysilicon layer from which is formed the first polysilicon capacitor plate 38, the second blanket polysilicon layer must also be conductive, preferably through in-situ incorporation of dopants during the process of forming the blanket second polysilicon layer. Other methods of making the blanket second polysilicon layer conductive through doping may be employed although such methods typically add to process complexity.

Preferably, the second polysilicon capacitor plate 44a and the polysilicon gate electrode 44b are from about 1000 to about 5000 angstroms thick each, and the second polysilicon capacitor plate 44a and the polysilicon gate electrode 44b are formed from polysilicon with about 1E19 to about 1E21 dopant atoms per cubic centimeter. Once the second polysilicon capacitor plate 44a and the polysilicon gate electrode 44b have been formed from the blanket second polysilicon layer, the thermally grown oxide layers 42a, 42b and 42c may be etched through methods as are conventional to the art to leave remaining the gate oxide 42c' beneath the polysilicon gate electrode 44b.

Finally, there is shown in FIG. 6 the presence of low dose ion implants 46a and 46b adjoining the gate oxide 42c' and the gate electrode 44b. Low dose ion implants are designed to reduce electric fields at gate electrode edges, which electric fields would otherwise contribute to spurious charge carrier effects within field effect transistors. Low dose ion implants are known in the art. The polarity to which a field effect transistor is designed will determine the polarity of the dopant employed in forming the low dose ion implants. For the preferred embodiment of the present invention, the low dose ion implants 46a and 46b may be provided through either a phosphorus dopant species (N polarity) or a boron dopant species (P polarity), preferably through ion implantation at an ion implantation dose of about $1 \times 10^{12}$ to about $1 \times 10^{13}$ ions per square centimeter and an ion implantation energy of about 10 to about 100 keV.

Figure 7:
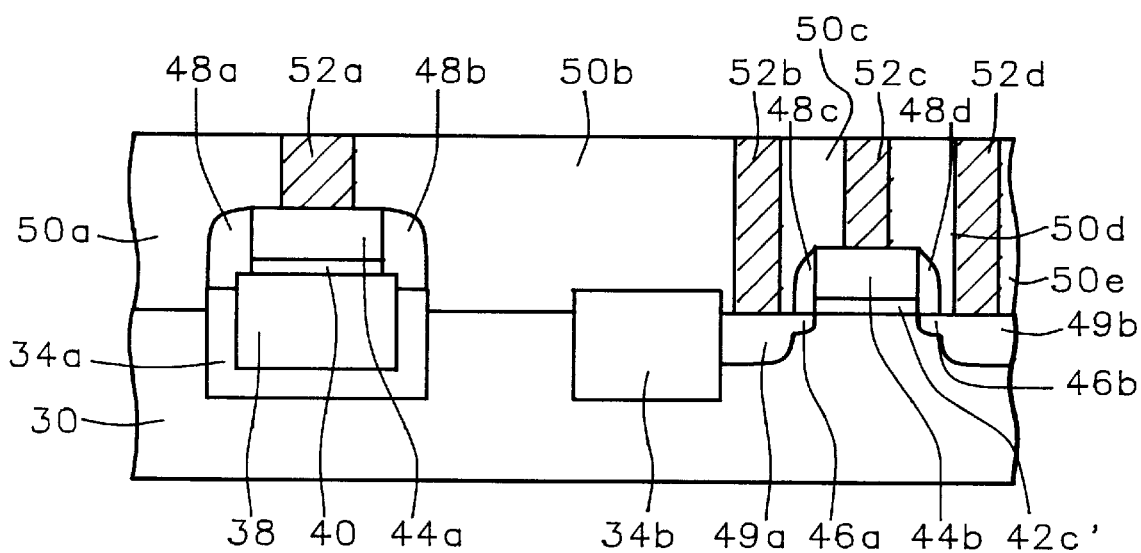

Referring now to FIG. 7 there is shown a schematic cross-sectional diagram illustrating the last series of process steps in which the planar polysilicon capacitor of the preferred embodiment of the present invention is formed into an integrated circuit. Shown in FIG. 7 is the presence of insulator spacers 48a and 48b, and 48c and 48d, along the edges, respectively, of the second polysilicon capacitor plate 44a and the polysilicon gate electrode 44b. Insulator spacers are known in the art. Insulator spacers are typically formed through anisotropic etching of blanket layers of insulator materials conformally deposited upon integrated circuit surfaces. Insulator materials from which may be formed insulator spacers include but are not limited to silicon oxides, silicon nitrides and silicon oxynitrides. For the preferred embodiment of the planar polysilicon capacitor of the present invention, the insulator spacers 48a, 48b, 48c and 48d may be formed through anisotropically etching a blanket layer of either a silicon oxide material, a silicon nitride material or a silicon oxynitride material in a Reactive Ion Etch (RIE) plasma employing an etchant gas appropriate to the material being etched.

Also shown in FIG. 7 is the presence of source/drain electrodes 49a and 49b. Source/drain electrodes are conventional to the art of field effect transistor fabrication. The polarity of the low dose ion implants 46a and 46b will dictate the polarity of the source/drain electrodes 49a and 49b. For the preferred embodiment of the present invention, the source/drain electrodes are preferably formed through implanting either arsenic dopant species, boron dopant species or phosphorus dopant species into the semiconductor substrate 30 at a dose of about $1\times10^{14}$ to about $1\times10^{16}$ ions per square centimeter and an ion implantation energy of about 10 to about 100 keV.

Also shown in FIG. 7 is the presence of patterned first insulator layers 50a, 50b, 50c, 50d and 50e. The methods through which insulator layers within integrated circuits may be formed and patterned are known in the art. Typically, although not exclusively, insulator layers are formed of silicon oxide materials formed upon semiconductor substrates through methods including but not limited to Chemical Vapor Deposition (CVD) methods and Plasma Enhanced Chemical Vapor Deposition (PECVD) methods. Typically, although not exclusively, insulator layers are patterned through Reactive Ion Etch (RIE) plasma etch processing. For the preferred embodiment of the present invention, the patterned first insulator layers 50a, 50b, 50c, 50d and 50e are preferably formed through patterning via Reactive Ion Etch (RIE) methods as are conventional in the art of a blanket layer of a silicon oxide material deposited through a Chemical Vapor Deposition (CVD) method.

Finally, there is shown in FIG. 7 a series of conductive contact studs 52a, 52b, 52c and 52d formed into the apertures between the patterned first insulator layers 50a, 50b, 50c, 50d and 50e. The contact stud 52a contacts the second polysilicon capacitor plate 44a. The conductive contact stud 52b contacts the source/drain electrode 49a. The conductive contact stud 52c contacts the polysilicon gate electrode 44b. Finally, the conductive contact stud 52d contacts the source/drain electrode 49b. Conductive contact studs are also known in the art. Conductive contact studs are typically formed of highly conductive materials such as aluminum, aluminum alloys, copper, doped polysilicon and tungsten. For the preferred embodiment of the present invention, the conductive contact studs 52a, 52b, 52c and 52d are preferably formed from tungsten, as is most common in the art.

Upon forming the conductive contact studs 52a, 52b, 52c and 52d, there is formed the planar polysilicon capacitor of the preferred embodiment of the present invention within an integrated circuit. The planar polysilicon capacitor of the preferred embodiment of the present invention has a height comparable to adjoining integrated circuit features within the integrated circuit within which is formed the planar polysilicon capacitor of the present invention. The planar polysilicon capacitor of the present invention also has electrical characteristics equivalent to planar polysilicon capacitors of equivalent dimensions formed at other locations within the same integrated circuit.

Figure 8:
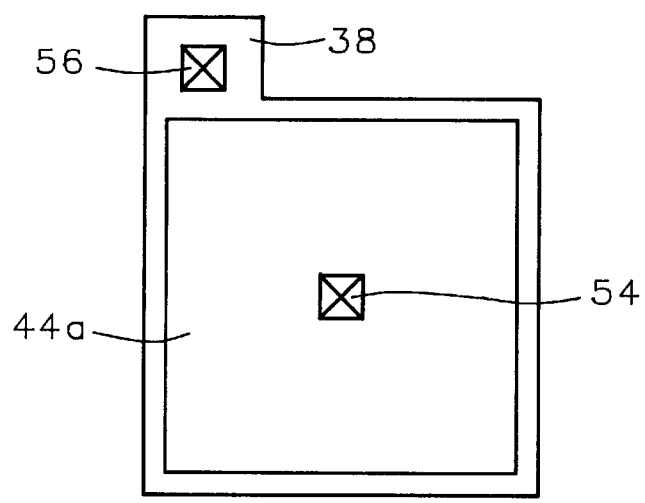
FIG. 8 shows a schematic plan-view diagram of the planar polysilicon capacitor of the present invention.

Referring now to FIG. 8, there is shown a plan-view schematic diagram of the planar polysilicon capacitor of the preferred embodiment of the present invention. The plan-view schematic diagram of FIG. 8 corresponds to the planar polysilicon capacitor shown in FIG. 6. The plan-view illustrates only the polysilicon capacitor, omitted are other elements of the integrated circuit shown within the cross-sectional schematic diagram of FIG. 6. Shown in FIG. 8 is the second polysilicon capacitor plate 44a which is coincident with the polysilicon capacitor dielectric layer 40 (not shown). Contained within the surface of the second polysilicon capacitor plate 44a is a second polysilicon capacitor plate contact 54. Finally, there is also shown a first polysilicon capacitor plate contact 56 which resides upon an exposed and extended portion of the first polysilicon capacitor plate 38. As is illustrated within the plan-view schematic diagram of FIG. 8, the areal dimensions of the second polysilicon capacitor plate 44a are smaller than and contained within the areal dimensions of the first polysilicon capacitor plate 38.

As is understood by a person skilled in the art, the description of the preferred embodiment of the planar polysilicon capacitor of the present invention is illustrative of the present invention rather than limiting of the present invention. Revisions may be made to methods and materials through which is formed the preferred embodiment of the planar polysilicon capacitor of the present invention while still forming an embodiment which is within the spirit and scope of the present invention.

What is claimed is:

1. A planar polysilicon capacitor for use within integrated circuits comprising:

a semiconductor substrate having a deep trench formed therein, the deep trench having a dielectric material formed therein;

a first polysilicon capacitor plate formed within a shallow trench formed within the dielectric material, an upper surface of the first polysilicon capacitor plate being a planar surface without interruption, the upper surface being substantially planar with a surface of the semiconductor substrate;

a polysilicon capacitor dielectric layer formed upon the first polysilicon capacitor plate; and a second polysilicon capacitor plate formed upon the polysilicon capacitor dielectric layer, where an upper surface of the second polysilicon capacitor plate rises above the upper surface of the first polysilicon capacitor plate.

2. The planar polysilicon capacitor as recited in claim 1 wherein the depth of the deep trench is from about 5000 to about 10000 angstroms.

3. The planar polysilicon capacitor as recited in claim 1 wherein the depth of the shallow trench is from about 1000 to about 5000 angstroms.

4. The planar polysilicon capacitor as recited in claim 1 wherein the first polysilicon capacitor plate is formed from polysilicon with about $1\times10^{19}$ to about $1\times10^{21}$ dopant atoms per cubic centimeter, at a thickness of about 1000 to about 5000 angstroms.

5. The planar polysilicon capacitor as recited in claim 1 wherein the polysilicon capacitor dielectric layer is from about 100 to about 1000 angstroms thick and the polysilicon capacitor dielectric layer is formed of a composite formed from a thermally grown oxide layer upon which is deposited a silicon nitride layer.

6. The planar polysilicon capacitor as recited in claim 1 wherein the second polysilicon capacitor plate is formed from polysilicon with about $1\times10^{19}$ to about $1\times10^{21}$ dopant atoms per cubic centimeter, at a thickness of about 1000 to about 5000 angstroms.

7. The planar polysilicon capacitor of claim 1 wherein the areal dimensions of the second polysilicon capacitor plate are smaller than and contained within the areal dimensions of the first polysilicon capacitor plate.

* * * * *